(12) United States Patent
Ferro et al.

(10) Patent No.: US 7,112,538 B2
(45) Date of Patent: Sep. 26, 2006

(54) IN SITU GROWTH OF OXIDE AND SILICON LAYERS

(75) Inventors: Armand Ferro, Phoenix, AZ (US); Ivo Raaijmakers, Phoenix, AZ (US); Derrick Foster, Scottsdale, AZ (US)

(73) Assignee: ASM America, Inc., Phoenix, AZ (US)

( * ) Notice: Subject to any disclaimer, the term of this patent is extended or adjusted under 35 U.S.C. 154(b) by 176 days.

(21) Appl. No.: 10/293,795

(22) Filed: Nov. 12, 2002

(65) Prior Publication Data
US 2003/0073293 A1 Apr. 17, 2003

Related U.S. Application Data

(63) Continuation of application No. 09/227,679, filed on Jan. 8, 1999, now Pat. No. 6,749,687.

(60) Provisional application No. 60/070,991, filed on Jan. 9, 1998.

(51) Int. Cl.
*H01L 21/31* (2006.01)
(52) U.S. Cl. .................. 438/763; 438/787
(58) Field of Classification Search .......... 438/481, 438/770, 909, 916, 920, 773, 787, 260, 489, 438/486, 478, 763; 257/191, 193, 337, 346
See application file for complete search history.

(56) References Cited

U.S. PATENT DOCUMENTS

| | | | |
|---|---|---|---|
| 3,258,359 A | * | 6/1966 | Hugle |
| 3,926,715 A | * | 12/1975 | Sussmann ............ 117/95 |
| 3,928,715 A | * | 12/1975 | Sussmann ............ 156/612 |
| 3,996,657 A | | 12/1976 | Simko et al. |
| 4,389,273 A | * | 6/1983 | Bloem et al. |
| 4,447,497 A | * | 5/1984 | Manasevit |
| 4,468,285 A | * | 8/1984 | Bayman et al. |
| 4,477,311 A | * | 10/1984 | Mimura et al. |
| 4,490,900 A | | 1/1985 | Chiu |
| 4,630,356 A | * | 12/1986 | Christie et al. |
| 4,828,224 A | * | 5/1989 | Crabb et al. |
| 4,833,100 A | * | 5/1989 | Hanafusa et al. |
| 4,846,102 A | * | 7/1989 | Ozias |
| 4,859,617 A | * | 8/1989 | Nomoto et al. |
| 4,874,464 A | * | 10/1989 | Goodwin et al. |
| 4,879,255 A | * | 11/1989 | Deguchi et al. |

(Continued)

FOREIGN PATENT DOCUMENTS

EP 0289 246 A1 11/1988

(Continued)

OTHER PUBLICATIONS

Euij. Kim, "Modeling of CVD of Silicon Dioxide Uding TEOs and Ozone In A Single Wafer Reactor", Journal, vol. 141, No. 12, pp. 3462-3472, a994.*

(Continued)

*Primary Examiner*—David S. Blum
(74) *Attorney, Agent, or Firm*—Knobbe, Martens, Olson & Bear, LLP

(57) ABSTRACT

A single-wafer, chemical vapor deposition reactor is provided with hydrogen and silicon source gas suitable for epitaxial silicon deposition, as well as a safe mixture of oxygen in a non-reactive gas. Methods are provided for forming oxide and silicon layers within the same chamber. In particular, a sacrificial oxidation is performed, followed by a hydrogen bake to sublime the oxide and leave a clean substrate. Epitaxial deposition can follow in situ. A protective oxide can also be formed over the epitaxial layer within the same chamber, preventing contamination of the critical epitaxial layer. Alternatively, the oxide layer can serve as the gate dielectric, and a polysilicon gate layer can be formed in situ over the oxide.

15 Claims, 4 Drawing Sheets

U.S. PATENT DOCUMENTS

| | | | | |
|---|---|---|---|---|
| 4,906,328 | A | * | 3/1990 | Freeman et al. |
| 4,913,929 | A | * | 4/1990 | Moslehi et al. ............... 427/39 |
| 5,004,703 | A | * | 4/1991 | Zdebel et al. |
| 5,011,789 | A | * | 4/1991 | Burns |
| 5,020,475 | A | * | 6/1991 | Crabb et al. |
| 5,066,610 | A | * | 11/1991 | Chen et al. |
| 5,067,437 | A | * | 11/1991 | Watanabe et al. |
| 5,079,177 | A | * | 1/1992 | Lage et al. |
| 5,092,728 | A | * | 3/1992 | Crabb et al. |
| 5,132,241 | A | * | 7/1992 | Su |
| 5,156,521 | A | * | 10/1992 | Crabb et al. |
| 5,221,556 | A | * | 6/1993 | Hawkins et al. |
| 5,225,032 | A | * | 7/1993 | Golecki |
| 5,248,385 | A | | 9/1993 | Powell |
| 5,288,364 | A | | 2/1994 | Burt et al. |
| 5,352,636 | A | | 10/1994 | Beinglass |
| 5,363,800 | A | | 11/1994 | Larkin et al. |
| 5,415,126 | A | | 5/1995 | Loboda et al. |
| 5,421,957 | A | | 6/1995 | Carlson et al. |
| 5,435,682 | A | | 7/1995 | Crabb et al. |
| 5,436,172 | A | | 7/1995 | Moslehi |
| 5,446,825 | A | | 8/1995 | Moslehi et al. |
| 5,492,854 | A | | 2/1996 | Ando |
| 5,632,821 | A | * | 5/1997 | Doi ........................... 134/1.1 |
| 5,635,409 | A | | 6/1997 | Moslehi |
| 5,730,801 | A | | 3/1998 | Tepman et al. |
| 5,735,949 | A | | 4/1998 | Mantl et al. |
| 5,780,342 | A | | 7/1998 | Wang |
| 5,851,892 | A | | 12/1998 | Lojek et al. |
| 5,913,135 | A | | 6/1999 | Chen |
| 5,943,581 | A | * | 8/1999 | Lu et al. |
| 5,997,588 | A | | 12/1999 | Goodwin et al. |
| 6,108,937 | A | | 8/2000 | Raaijmakers |
| 6,167,834 | B1 | | 1/2001 | Wang et al. |
| 6,749,687 | B1 | | 6/2004 | Ferro et al. |
| 6,830,964 | B1 | | 12/2004 | Mears et al. |
| 2004/0206297 | A1 | | 10/2004 | Ferro et al. |

FOREIGN PATENT DOCUMENTS

| | | | |
|---|---|---|---|
| EP | 0637 063 A1 | | 7/1994 |
| EP | 0730 048 A1 | | 9/1996 |
| JP | HEI 1-293665 | | 11/1989 |
| JP | 07193011 | * | 12/1993 |
| JP | 09115985 | * | 10/1995 |

OTHER PUBLICATIONS

Wolf et al., "Silicon Epitaxial Film Growth," Silicon Processing for the VLSI Era, vol. 1: Process Technology, Lattice Press, Sunset Beach, CA, USA, pp. 124-159.

Ghidini and Smith, "*Interaction of $H_2O$ with Si(111) and (100): Critical Conditions for the Growth of $SiO_2$*", Journal of Electrochemical Soc.: Solid State Science and Technology, vol. 131, No. 12, Dec. 1984, pp. 2924-2928.

Kern, Werner and David A. Puotinen, "*Cleaning Solutions Based on Hydrogen Peroxide for use in Silicon Semiconductor Technology*", RCA Review, vol. 31, No. 2, Jun. 1970 pp. 187-206.

Kim, Maillot, Morgan, Kermani and Ku, "*Formation of β-SiC at the interface between an epitaxial Si layer grown by rapid thermal chemical vapor deposition and a Si substrate*". Journal of Applied Physics, vol. 67, No. 4, Feb. 15, 1990, pp. 2176-2179.

MERCK Index, 6th Ed., p. 507, 1952.

Miyauchi, Inoue, Ohue, Momma, Suzuki and Akiyama, "*Low-Temperature (900° C.) Si Epitaxial Growth on Si (100) after HF Treatment.*", Journal of Electrochemical Soc., vol. 137, No. 10, Oct. 1990, pp. 3257-3260.

NASA Lewis Safety Manual, Chapter 6 "*Hydrogen Propellant*", http://www-osma.lerc.nasa.gov/lsm/lsm6.htm, (revised Oct. 1996) pp. 1-71.

Smith and Ghidini, "*Reaction of Oxygen with Si(111) and (100): Critical conditions for the Growth of $SiO_2$*", Journal of Electrochemical Soc.: Solid State Science and Technology, vol. 129, No. 6, Jun. 1982, pp. 1300-1306.

Wolf et al., "*Silicon Processing for the VLSI Era*," vol. 1: Process Technology, Lattice Press, Sunset Beach, CA, USA, pp. 124-158, 162-167, 175-179, 198-199, 209-211, 230, 581-582, 1986.

Complaint in RJ Mears, LLC v. ASM America, Inc., Superior Court, Commonwealth of Massachusetts, Civil Action No. 05-4245, filed Dec. 8, 2005, 14 pgs.

ASM America, Inc's Answer and Counterclaims to RJ Mears, LLC's Complaint, *RJ Mears, LLC v. ASM America, Inc.*, U.S. District Court, District of Massachusetts, Case No. 06-10505-PBS, filed Mar. 30, 2006, 19 pgs.

Amended Complaint in *ASM America, Inc. v. RJ Mears, LLC*, U.S. District Court, District of Massachusetts, Civil Action No. 06-10447-PBS, filed Apr. 3, 2006, 13 pgs.

Amended Complaint, filed Apr. 3, 2006 in U.S. District Court for the District of Massachusetts, Civil Action No. 06-10447-PBS, 13 pgs.

Plaintiff RJ Mears, LLC's Motion to Remand, filed Apr. 19, 2006 in U.S. District Court for the District of Massachusetts, Civil Action No. 06-10505-PBS, 2 pgs.

Memorandum in Support of Plaintiff RJ Mears, LLC's Motion to Remand and Exhibits A & B, filed Apr. 19, 2006 in U.S. District Court for the District of Massachusetts, Civil Action No. 06-10505-PBS, 14 pgs.

RJ Mears, LLC's Motion to Dismiss, filed Apr. 25, 2006 in U.S. District Court for the District of Massachusetts, Civil Action No. 06-10447-PBS, 2 pgs.

Memorandum in Support of Defendant RJ Mears, LLC's Motion to Dismiss and Exhibits A-E, filed Apr. 25, 2006 in U.S. District Court for the District of Massachusetts, Civil Action No. 06-10447-PBS, 13 pgs.

Defendant ASM America, Inc.'s Opposition to Plaintiff RJ Mears, LLC's Motion to Remand and Exhibits A-D, filed May 3, 2006 in U.S. District Court for the District of Massachusetts, Civil Action No. 06-10505-PBS, 16 pgs.

Plaintiff FJ Mears, LLC's Initial Disclosures, dated May 8, 2006 in U.S. District Court for the District of Massachusetts, Civil Action No. 06-10505-PBS, 6 pgs.

ASM America, Inc's Disclosures Pursuant to Rule 26(a)(1), dated May 8, 2006 in U.S. District Court for the District of Massachusetts, Civil Action No. 06-10505-PBS, 4 pgs.

Plaintiff ASM America, Inc.'s Opposition to Defendant RJ Mears, LLC's Motion to Dismiss, filed May 9, 2006 in U.S. District Court for the District of Massachusetts, Civil Action No. 06-10447-PBS, 15 pgs.

* cited by examiner ature. In a typical wafer treatment step, reactant gases are passed over the heated wafer, causing the chemical vapor deposition (CVD) of a thin layer of the reactant material on the wafer. Various process conditions, particularly temperature uniformity and reactant gas distribution, must be carefully controlled to ensure the high quality of the resulting layers.
IN SITU GROWTH OF OXIDE AND SILICON LAYERS

REFERENCE TO RELATED APPLICATION

This application is a continuation of Application No. 09/227,679, filed Jan. 8, 1999 (now U.S. Pat. No. 6,749,687, issued Jun. 15, 2004), which claims the priority benefit of provisional Application No. 60/070,991, filed Jan. 9, 1998.

FIELD OF THE INVENTION

The present invention relates to forming oxide and silicon layers within a single semiconductor processing chamber, and more particularly to thermal oxidation within a single-wafer epitaxial silicon deposition chamber.

BACKGROUND OF THE INVENTION

High-temperature ovens, called reactors, are used to create structures of very fine dimensions, such as integrated circuits on semiconductor substrates. One or more substrates, such as silicon wafers, are placed on a wafer support inside the reaction chamber. Both the wafer and support are heated to a desired temperature. In a typical wafer treatment step, reactant gases are passed over the heated wafer, causing the chemical vapor deposition (CVD) of a thin layer of the reactant material on the wafer. Various process conditions, particularly temperature uniformity and reactant gas distribution, must be carefully controlled to ensure the high quality of the resulting layers.

Through a series of deposition, doping, photolithography and etch steps, the starting substrate and the subsequent layers are converted into integrated circuits, with a single layer producing from tens to thousands or even millions of integrated devices, depending on the size of the wafer and the complexity of the circuits.

Batch processors have traditionally been employed in the semiconductor industry to allow multiple wafers to be processed simultaneously, thus economically presenting low processing times and costs per wafer. Recent advances in miniaturization and attendant circuit density, however, have lowered tolerances for imperfections in semiconductor processing. Accordingly, single wafer processing reactors have been developed for improved control of deposition conditions.

Among other process parameters, single wafer processing has greatly improved temperature and gas flow distribution across the wafer. In exchange for greater process control, however, processing time has become even more critical than with batch systems. Every second added to processing times must be multiplied by the number of wafers being processed serially, one at a time, through the same single-wafer processing chamber. Conversely, any improvements in wafer throughput can translate to significant fabrication cost savings.

One process for which process control is particularly critical, and for which single wafer processing is particularly useful, is the formation of epitaxial layers. If the deposited layer has the same crystallographic structure as the underlying silicon wafer, it is called an epitaxial layer. Through careful control of deposition conditions, reactant gases are passed over a heated substrate such that the deposited species precipitates in conformity with the underlying crystal structure, which is thus extended into the growing layer. As is known in the art, epitaxial layers can be formed of intrinsic or doped silicon, silicon germanium, or other semiconductor materials. The lowest level of devices, including transistors, are often formed within an epitaxial layer formed over a semiconductor substrate.

Because integrated devices are formed within the epitaxial layer, it is important that the epitaxial layer maintain a pure crystal structure, free of contamination which could affect device operation. The purity and crystalline structure of the underlying substrate (or other base layer) prior to epitaxial deposition is one factor affecting the resultant epitaxial layer. Contaminants at the substrate surface can interfere with the crystal structure of the epitaxial layer, or with the electrical properties of devices made out of the epitaxial layer. Similarly, crystal dislocations in the underlying layer are propagated through the growing epitaxial layer. Of course, contamination of the epitaxial layer after formation can also critically affect electrical characteristics of the devices formed therein.

A need exists, therefore, for methods of purifying substrate surfaces prior to chemical vapor deposition, and of maintaining the purity of a deposited layer after formation. Desirably, such methods should be compatible with single-wafer, epitaxial silicon deposition chambers without increasing system costs or reducing wafer throughput.

SUMMARY OF THE INVENTION

These and other needs are satisfied by several aspects of the present invention.

In accordance with one aspect of the present invention, an atmospheric silicon deposition reactor includes a single-substrate reaction chamber. A reaction gas inlet and an outlet of the chamber define a gas flow path between them. A support is included for supporting a substrate within the gas flow path. The reactor includes a source of hydrogen gas suitable for flowing through the reaction chamber as a carrier gas during epitaxial silicon deposition, a source of silicon-containing gas, and a source of a gaseous oxidizing agent suitable for thermal growth of silicon dioxide from a silicon layer. Gas lines connect the sources of gases to the reaction chamber.

In accordance with another aspect of the invention, a chemical vapor deposition reactor includes a process chamber with a gas inlet and a gas outlet. A first gas line communicates hydrogen gas between a hydrogen container and the gas inlet. A second gas line communicates a mixture of $O_2$ and a non-reactive gas between an oxidant source container and the gas inlet. The level of oxygen in oxidant source container is non-explosive in the presence of any amount of hydrogen under operating conditions of the process chamber.

In accordance with another aspect of the invention, a method of processing semiconductor substrates includes forming an epitaxial layer containing silicon in a chemical vapor deposition chamber and forming an oxide layer over the epitaxial layer within the chamber.

In accordance with another aspect of the invention, a method of fabricating integrated circuits on a semiconductor substrate includes loading the substrate into a chemical vapor deposition processing chamber. An epitaxial silicon layer is deposited on at least part of the substrate within the chamber. A thermal oxide layer is grown over the epitaxial silicon layer within the chamber, and a polysilicon layer is deposited over the thermal oxide layer, also within the chamber.

In accordance with another aspect of the invention, a method of processing a semiconductor substrate includes loading the substrate into a chemical vapor deposition chamber. An oxidant source gas including O₂ is introduced into the chamber, and an oxide is grown from a silicon surface of the substrate. The flow of the oxidant source gas is shut off, and the oxidant source gas purged from the chamber with a gas containing hydrogen.

In accordance with another aspect of the invention, a method of forming layers over a semiconductor substrate in a single substrate reactor includes loading the substrate into a single-substrate reaction chamber. An oxide layer is grown over the substrate, within the reaction chamber at about atmospheric pressure, by exposing a top surface of the substrate to an oxidant. A silicon layer is deposited, within the reaction chamber at about atmospheric pressure, directly on the oxide layer.

BRIEF DESCRIPTION OF THE DRAWINGS

These and further aspects of the invention will be readily apparent to the skilled artisan from the following description and the attached drawings, wherein.

DETAILED DESCRIPTION OF THE PREFERRED EMBODIMENT

While the preferred embodiments are discussed in the context of single-substrate, epitaxial silicon deposition, it will be understood that certain aspects of the invention will have application to non-epitaxial layers and deposition reactors of other types. Furthermore, while a series of process steps are disclosed herein for treating a single substrate, one of ordinary skill in the art will recognize the utility of certain of the disclosed steps even in the absence of some of the disclosed steps.

Preferred Reactor

Figure 1:
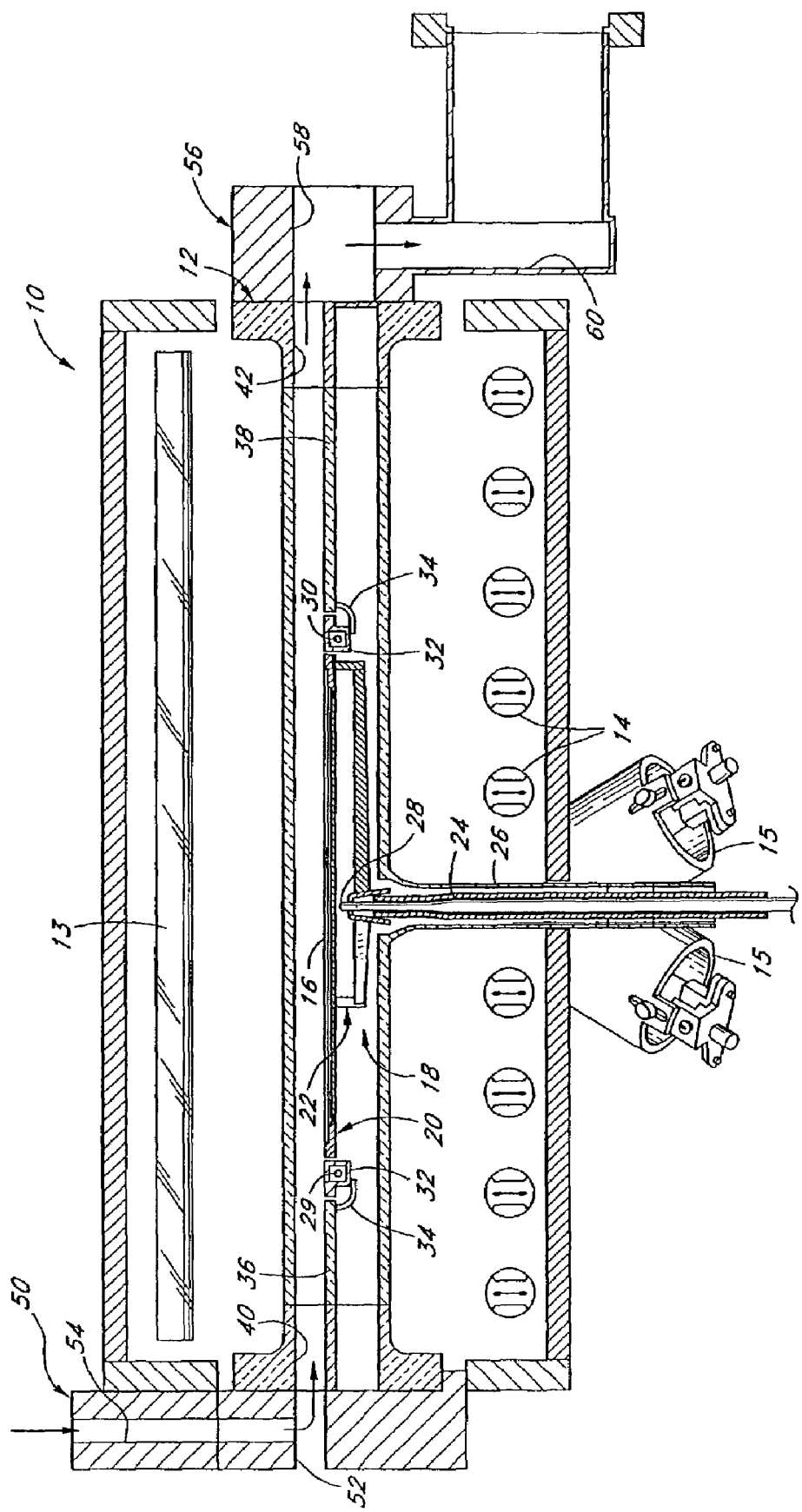
FIG. 1 is a schematic sectional view of an exemplary single-substrate reaction chamber.

FIG. 1 shows a chemical vapor deposition (CVD) reactor 10, including a quartz process or reaction chamber 12, constructed in accordance with a preferred embodiment, and for which the methods disclosed herein have particular utility. The illustrated reactor 10 is specifically designed to optimize epitaxial deposition of silicon on a single substrate at a time, though it can also be employed for CVD of a number of different types of layers, as will be apparent from the discussion of FIG. 3, hereinbelow.

A plurality of radiant heat sources are supported outside the chamber 12, to provide heat energy to the chamber 12 without appreciable absorption by the quartz chamber 12 walls. While the preferred embodiments are described in the context of a "cold wall" CVD reactor for processing semiconductor wafers, it will be understood that the processing methods described herein will have utility in conjunction with other heating/cooling systems, such as those employing inductive or resistive heating.

The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates above and below the upper and lower lamps 13, 14, respectively. Additionally, a plurality of spot lamps 15 supply concentrated heat to the underside of the wafer support structure (described below), to counteract a heat sink effect created by cold support structures extending through the bottom of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors.

A substrate, preferably comprising a silicon wafer 16, is shown supported within the reaction chamber 12 upon a substrate or wafer support structure 18. Note that while the substrate of the illustrated embodiment is a single crystal silicon wafer, it will be understood that the term "substrate" broadly refers to any surface on which a layer is to be deposited. Moreover, cleaning and prevention of contamination is often required in depositing layers on other substrates, including, without limitation, the deposition of optical thin films on glass or other substrates.

The illustrated support structure 18 includes a wafer holder 20, upon which the wafer 16 rests, and a support spider 22. The spider 22 is mounted to a shaft 24, which extends downwardly through a tube 26 depending from the chamber 12 lower wall. Preferably, the tube 26 communicates with a source of purge gas which can flow during processing, inhibiting process gases from escaping to backside of the wafer A plurality of temperature sensors are positioned in proximity to the wafer 16. The temperature sensors may take any of a variety of forms, such as optical pyrometers or thermocouples. The number and positions of the temperature sensors are selected to promote temperature uniformity, as will be understood in light of the description below of the preferred temperature controller. Preferably, however, the temperature sensors directly or indirectly sense the temperature of positions in proximity to the wafer.

In the illustrated embodiment, the temperature sensors comprise thermocouples, including a first or central thermocouple 28, suspended below the wafer holder 20 in any suitable fashion. The illustrated central thermocouple 28 passes through upon the spider 22 in proximity to the wafer holder 22. The reactor 10 further includes a plurality of secondary or peripheral thermocouples, also in proximity to the wafer 16, including a leading edge or front thermocouple 30, a trailing edge or rear thermocouple 31, and a side thermocouple 31 (not shown). Each of the peripheral thermocouples are housed within a slip ring 32 which surrounds the wafer holder 20 and wafer 16. Each of the central and peripheral thermocouples are connected to a temperature controller, which sets the power of the various heating elements 14 in response to the readings of the thermocouples.

In addition to housing the peripheral thermocouples, the slip ring 32 absorbs and emits radiant heat during high temperature processing, such that it compensates for a tendency toward greater heat loss or absorption at wafer edges, a phenomenon which is known to occur due to a greater ratio of surface area to volume in regions near such edges. By minimizing edge losses and the attending radial temperature non-uniformities across the wafer 16, the slip ring 32 can reduce the risk of crystallographic slip. The slip ring 32 can be suspended by any suitable means. For example, the illustrated slip ring 32 rests upon elbows 34 which depend from a front chamber divider 36 and a rear chamber divider 38. The dividers 36, 38 desirably are formed of quartz.

The illustrated reaction chamber 12 includes an inlet port 40 for the injection of reactant and carrier gases, and the wafer 16 can also be received therethrough. An outlet port 42 is on the opposite side of the chamber 12, with the wafer support structure 18 positioned between the inlet 40 and outlet 42.

An inlet component 50 is fitted to the reaction chamber, adapted to surround the inlet port 40, and includes a horizontally elongated slot 52 through which the wafer 16 can be inserted. A generally vertical inlet 54 receives gases from remote sources, as will be described more fully with respect to FIG. 2, and communicates such gases with the slot 52 and the inlet port 40. The inlet 54 can include gas injectors as described in U.S. Pat. No. 5,221,556, issued Hawkins et al., or as described with respect to FIGS. 21–26 in U.S. patent application Ser. No. 08/637,616, filed Apr. 25, 1996, the disclosures of which are hereby incorporated by reference. Such injectors are designed to maximize uniformity of gas flow for the single-wafer reactor.

An outlet component 56 similarly mounts to the process chamber 12 such that an exhaust opening 58 aligns with the outlet port 42 and leads to exhaust conduits 60. The conduits 60, in turn, communicate with suitable vacuum means (not shown) for drawing process gases through the chamber 12. In the preferred embodiment, process gases are drawn through the reaction chamber 12 and a downstream scrubber without the aid of a pump. While, in other arrangements, a pump or fan may be included to aid in drawing process gases through the chamber 12, the preferred reactor is not configured as a vacuum chamber as that term is understood in the art of chemical vapor deposition.

Wafers are preferably passed from a handling chamber (not shown), which is isolated from the surrounding environment, through the slot 52 by a pick-up device. While a fork or paddle can serve as the handling device, the preferred pick-up device comprises a wand which shoots high velocity streams of gas at angles, as described in U.S. Pat. No. 4,846,102, the disclosure of which is hereby incorporated by reference. When brought close to the top of a wafer surface, the gas streams create a low pressure zone above the wafer, causing the wafer to lift. The handling chamber and the processing chamber 12 are preferably separated by a gate valve (not shown) of the type disclosed in U.S. Pat. No. 4,828,224, the disclosure of which is hereby incorporated by reference.

The total volume capacity of single wafer process chambers designed for processing 200 mm wafers, for example, is preferably less than about 30 liters, more preferably less than about 20 liters, and most preferably less than about 10. The illustrated chamber has a capacity of about 7.5 liters. Because the chamber 12 is divided by the dividers 32, 38, wafer holder 20, ring 32, and the purge gas flowing from the tube 26, however, the effective volume through which process gases flow is around half the total volume (about 3.77 liters in the illustrated embodiment). Of course, it will be understood that the volume of the single-wafer process chamber 12 can be different, depending upon the size of the wafers meant to be processed therein. For example, a single-wafer processing chamber of the illustrated type, but for 300 mm wafers, preferably has a capacity of less than about 100 liters, preferably less than about 60 liters, and more preferably less than about 30 liters. One 300 mm wafer processing chamber has a total volume of about 24 liters, with an effective processing gas capacity of about 11.83 liters.

Figure 3:
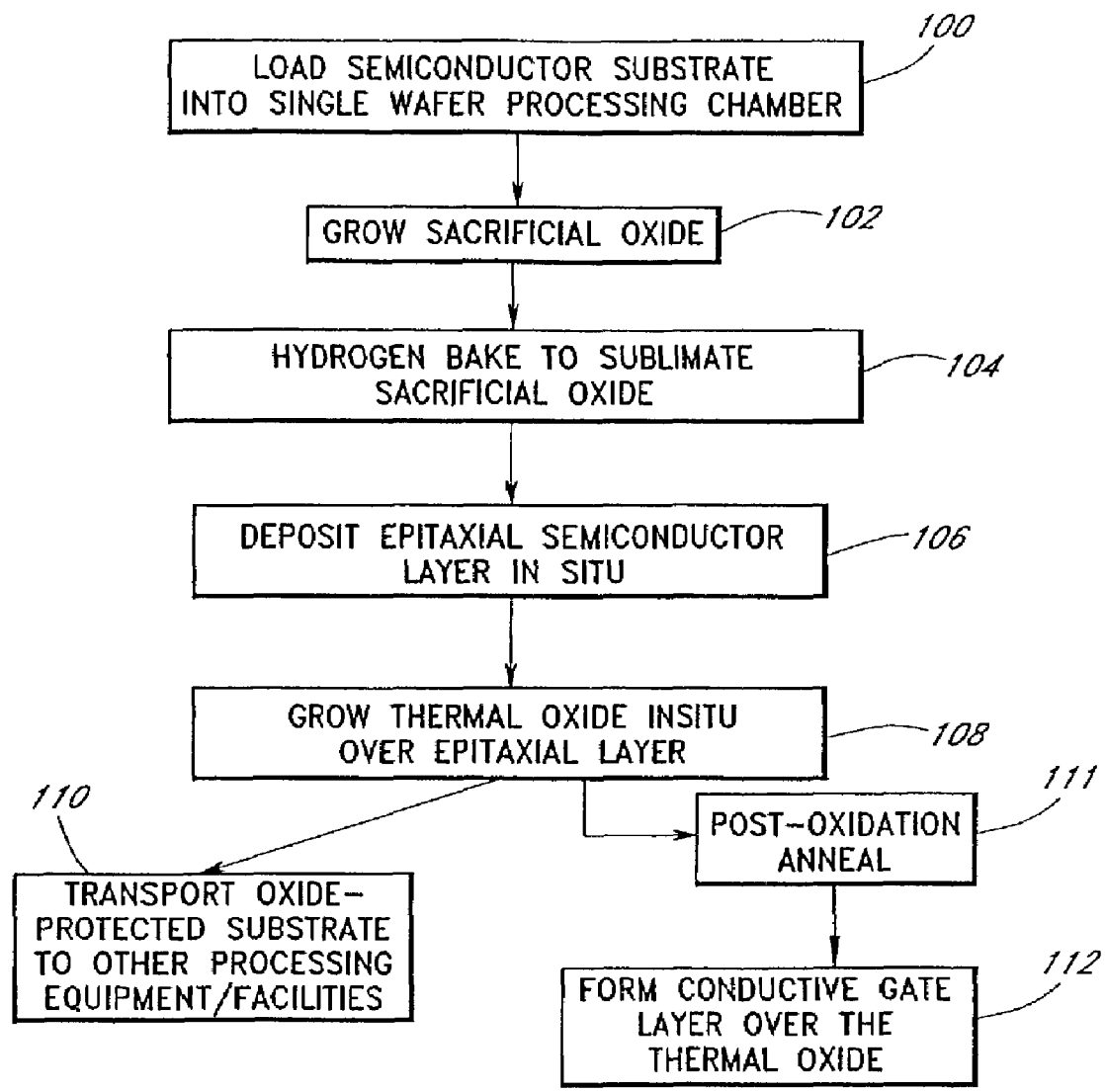
FIG. 3 is a flow chart generally showing steps for treating substrates in accordance with the preferred embodiments.

As indicated in FIG. 3, a first step in the preferred method is to load a single wafer in the reaction chamber 12 (FIG. 1). As noted in the "Background" section above, the purity of a substrate surface can critically affect the quality of a layer deposited thereon, particularly for epitaxial deposited layers. A common source of contamination of semiconductor substrates is native oxide, which naturally forms on naked silicon surfaces upon exposure to the atmosphere. Carbon contaminants also tend to be found at the surface of semiconductor wafers, as received from wafer suppliers.

Such exposure and contamination is inevitable in transporting wafers from vendors to fabrication facilities, and transporting wafers among processing equipment. Typically, for example, polished silicon wafers are provided by independent suppliers. Yet another set of suppliers often obtain wafers, apply epitaxial layers, and furnish these wafers to fabrication facilities. Even when epitaxial layers and later fabrication steps performed at the same facility, wafers are often exposed to atmospheric contaminants and plastic handling equipment between processing steps in different parts of the facility.

One method of removing native oxide is to expose the substrate to hydrogen in high temperature bake or anneal steps. Silicon dioxide ($SiO_2$) at the substrate surface tends to sublimate as SiO, leaving a clean substrate surface ready for epitaxial deposition. Such hydrogen bake steps have generally been effective only at relatively high temperatures for long periods of time (e.g., at about 1200° C. for about 90 seconds). The high temperatures and long exposures are believed to be required to diffuse carbon contaminants into the substrate bulk and away from the surface, small temperature non-uniformities during such high temperature steps can itself cause crystallographic slip, or dislocations. Furthermore, ramping the temperature up to hydrogen anneal temperatures and then back down to epitaxial deposition temperatures adds to production time and costs for each wafer processed.

Traditional alternatives to hydrogen annealing include hydrofluoric acid (HF) wet pre-cleaning, or HF vapor etches. However, the extra handling and process steps necessitated by ex situ processes raise production times and costs considerably, while fluorine processes are incompatible with most cold-wall (quartz chamber) reactors.

U.S. Pat. No. 3,926,715, issued to Süssmann, discloses another method of cleaning silicon substrates prior to epitaxial deposition. In the context of batch processing reactor, Süssmann discloses oxidizing and annealing multiple silicon wafers at high temperatures. Total exposure to these high temperature steps, however, is about 7 to 22 minutes. As noted above, the high likelihood of small temperature non-uniformities during such extended high temperature steps tends to produce crystallographic slip to an extent unacceptable for today's high density circuitry.

Moreover, use of oxygen and hydrogen in the same reactor creates a serious risk of explosion. While flowing purge gas between oxygen steps and hydrogen steps may be effective for the reactor type disclosed in Süssmann, it is unlikely to be so effective for the single-wafer reactor design illustrated in FIG. 1. Even a spark or minor explosion caused by residual $H_2$ gas (trapped, for example, below dividers 36, 38) while flowing oxygen, or vice versa, can destroy the quartz walls of the cold-wall chamber 12. Traditionally, therefore, concurrent or even sequential use of oxygen and hydrogen within a single-wafer chamber has not been considered commercially feasible, particularly within epitaxial reactors, for which high flow rates of hydrogen are typically used for carrier gas, purging, and oxide sublimation. Risk of explosion through interaction of oxidants with $H_2$ is also particularly high for atmospheric pressure CVD reactors, as compared to vacuum chambers.

Figure 2:
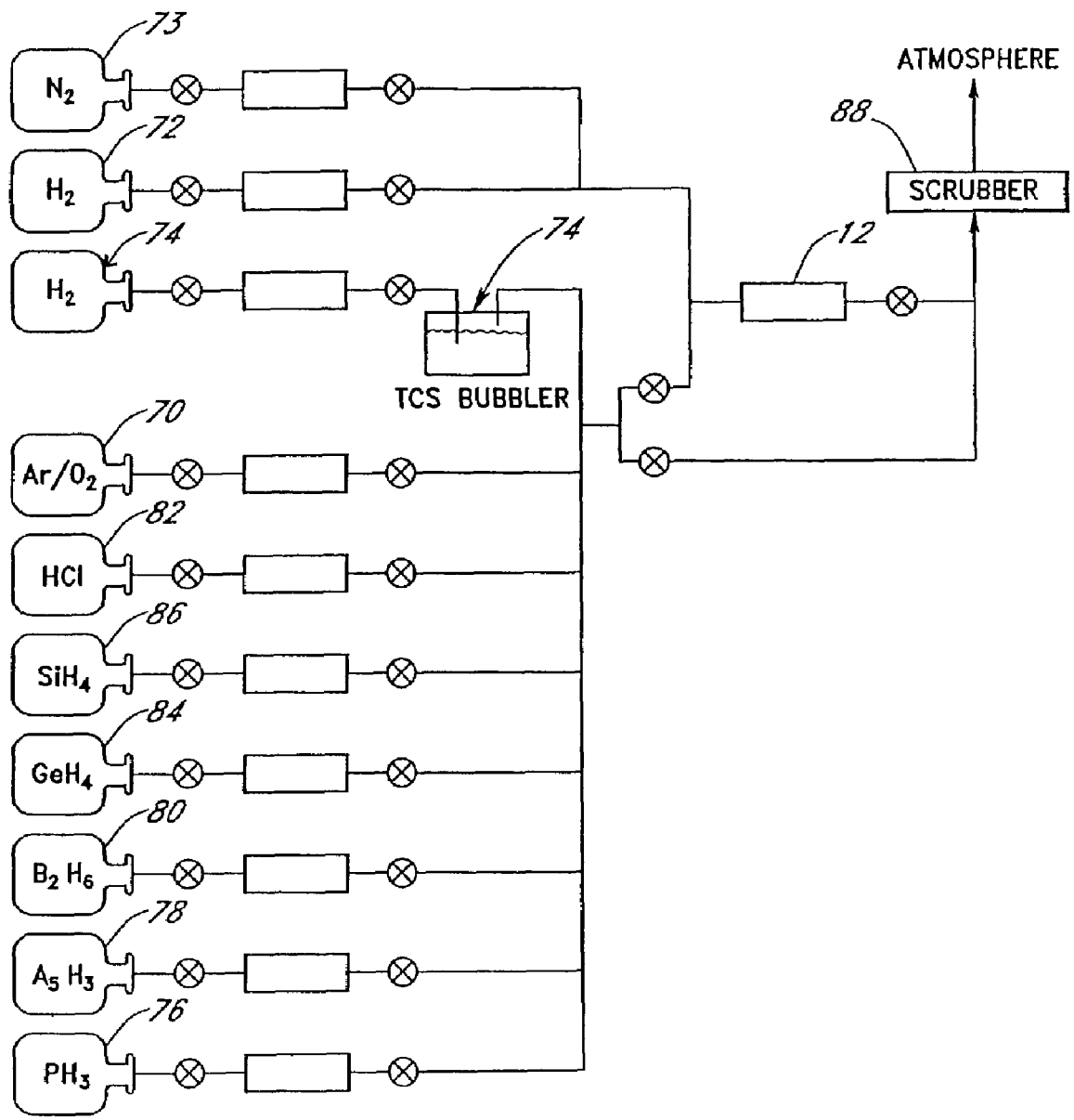
FIG. 2 is a gas flow schematic, illustrating gas sources in accordance with a preferred embodiment of the present invention.

FIG. 2 shows a gas line schematic, in accordance with the preferred embodiment. The reactor 10 is provided with a source 70 of oxidizing agent or oxidant. The oxidant source 70 can comprise any of a number of known oxidants, such as NO, $H_2O$, $N_2O$, or HCOOH, $HClO_3$, and particularly a volatile oxidant, but most preferably comprises oxygen gas ($O_2$), such as can be utilized for high quality dry oxidation. The preferred oxidant source 70 comprises a tank or other container holding a mixture of an oxidant and a non-reactive gas, such as $N_2$, more preferably a noble or inert gas such as Ar, He or Ne. The mixture in the preferred oxidant source 70 is such that it is non-explosive even if the non-reactive gas were replaced with pure hydrogen. Such a mixture will be non-explosive when mixed in any composition with pure hydrogen ($H_2$).

In particular, the percentage of oxidant in the mixture is less than the explosive limit for mixtures of the oxidant with $H_2$. For oxygen gas, the explosive limit is about 6.1% $O_2$ by volume at room temperature and atmospheric pressure. It will be understood that at different temperature and pressure conditions, the explosive limit will differ slightly from that given above, and can be readily obtained for particular reactor conditions by one of skill in the art.

Below the explosive limit, the mixture of $O_2$ and inert gas will not explode even if all of the inert gas is replaced with $H_2$. Accordingly, the stored mixture is "safe" when attached to a reactor with high $H_2$ flow rates, even operated at atmospheric pressure, and even if MFCs or gas valves should fail. The oxidant mixture 70 can be mixed with any amount of pure $H_2$ and remain non-explosive, as the additional gas can only dilute the oxidant level.

The lower limit for the percentage of oxidant depends upon its intended use and time acceptable for oxidation, but can be as low as 0.1% (for pre-epitaxial cleaning, e.g., as will be understood from the discussion of FIG. 3). For other uses (e.g., growth of a high quality gate oxide), the oxidant source 70 should include at least about 1% $O_2$. More preferably, the oxidant source 70 includes at least 2% $O_2$. Most preferably, the oxidant mixture 70 is as close as possible to the explosive limit for the given conditions without exceeding it.

Accordingly, the oxidant source for the preferred reactor conditions preferably comprises less than about 6% $O_2$ in a mixture with a noble gas, and particularly between about 1% and 5% $O_2$.

As also shown in FIG. 2, the reactor 10 further includes a source 72 of hydrogen gas ($H_2$). As is known in the art, hydrogen is a useful carrier gas and purge gas because it can be provided in very high purity, due to its low boiling point, and is compatible with silicon deposition. A source 73 of nitrogen gas is also shown. As is known in the art, $N_2$ can be used as a carrier or purge gas for many processes.

A source 74 of silicon-containing gas is also shown. The silicon source gas can comprise, for example, silane or dichlorosilane (DCS), trichlorosilane (TCS), or other known silicon sources. The illustrated silicon source 74 includes a bubbler and a gas line for bubbling $H_2$ through a liquid silicon source such as the illustrated TCS, to more effectively transport silicon to the reaction chamber in gaseous form.

Desirably, the reactor 10 will also include other source gases such as dopant sources (e.g., the illustrated phosphine 76, arsine 78 and diborane 80 sources) and etchants for cleaning the reactor walls (e.g., HCl source 82). Additional illustrated source gases include a germanium source 84, which can be utilized for doping or formation of SiGe films, and a silane source 86, which may be used for deposition of silicon (polycrystalline, amorphous or epitaxial, depending upon deposition parameters). While not shown, a source of ammonia ($NH_3$) can also be provided.

Each of the gas sources may be connected to the inlet 54 (FIG. 1) via gas lines with attendant safety and control valves, as well as mass flow controllers ("MFCs") which are coordinated at a gas panel. Process gases are communicated to the inlet 54 (FIG. 1) in accordance with directions programmed into a central controller and distributed into the process chamber 12 through injectors. After passing through the process chamber, unreacted process gases and gaseous reaction by-products are exhausted to a scrubber 88 to condense environmentally dangerous fumes before exhausting to the atmosphere.

Substrate Cleaning Process

Referring again to FIG. 3, after the wafer is loaded 100 into the preferred reactor processing chamber, the gate valve is closed and process gases can be injected into the process chamber. In accordance with the illustrated embodiment, a first process is to grow 102 a sacrificial oxide. In the preferred reactor 10 (FIGS. 1 and 2), sacrificial oxidation and each of the disclosed processes is conducted at about atmospheric pressure. Slight pressure differentials due to gas flow are of negligible effect.

Prior to flowing process gases for reaction in the first process, however, purge gas is preferably flowed through the chamber to remove any atmospheric contaminants which may have been introduced through the gate valve during loading of the substrate. Desirably, $H_2$ is flowed from the inlet port 40 to the outlet port 42, as well as through the depending tube 26 to the underside of the wafer holder 20 (see FIG. 1). An exemplary $H_2$ flow rate is about 45 slm.

During purging, the temperature of the substrate can be ramped to the desired process temperature by increasing power output to the lamps 13, 14, 15. Preferably, the sacrificial oxidation 102 is conducted between about 700° C. and 1100° C., more preferably between about 800° C. and 1000° C. Since the sacrificial oxide is to be removed and the thickness is not critical, temperature ramping can also be performed during oxidation 102.

The oxidizing agent is introduced to the reaction chamber in a non-explosive mixture. An oxidant source such as pure $O_2$, for example, can be introduced with the flowing $H_2$ gas serving as the carrier, such that the ratio of $O_2$:$H_2$ is below the explosive limit for the given conditions.

Preferably, however, the oxidant is stored in a safe mixture with a non-reactive gas, as disclosed above with respect to FIG. 2, such that the mixture would be non-explosive even if all of the non-reactive gas were replaced with $H_2$. In this way, the oxidant source is safe even in the face of failures by mass flow controllers or valve integrity. The gas from this safe oxidant source 70 (FIG. 2) can be flowed with or without shutting off the $H_2$ flow. However, the $H_2$ flow is preferably shut off during the oxidation, resulting in less diluted oxidant in the flow and consequently higher oxidation rates. Significantly, even if $H_2$ flow is shut off, the $H_2$ does not need to be purged with inert gas before introducing the oxidant to the reaction chamber, and the oxidation 102 can begin immediately.

In one embodiment, HCl or other chlorine-containing vapor is added to the oxidant flow, to aid in removal of metal contaminants from the substrate surface. Alternatively, HCl can be added to the hydrogen bake step, described below, for the same purpose.

The oxidation 102 proceeds long enough to clean contaminants from the surface of the substrate. In particular, surface carbon is burned off as $CO_2$ or CO during the oxidation 102. The targeted oxide thickness is between about 0.5 Å and 100 Å, more preferably between about 0.5 Å and 20 Å, and most preferably between about 1 Å and 5 Å. Preferably, the oxidant is flowed for about 2 seconds to 60 seconds, depending upon the chosen temperature and oxidant concentration. One of ordinary skill in the art can optimize the length of time or oxide thickness required for the oxidation 102 to sufficiently clean the substrate of contaminants without wasteful oxide growth.

Referring again to FIG. 3, the sacrificial oxide grown by the previously described process is then removed or etched in a sublimation process within the same chamber. The preferred sublimation comprises a hydrogen bake or anneal 104, in which the silicon oxide is subjected to hydrogen flow at elevated temperatures.

In accordance with the preferred embodiment, the overall time required for initiation and performance of the hydrogen bake 104 is minimized by many factors. Preferably, the substrate on which the oxide is grown is not removed from the process chamber 12 between oxidation 102 and hydrogen bake 104. Additionally, when the oxidant flow is shut off, the oxidant need not be purged with an inert gas in a separate step. Rather, due to the safe mixture of the preferred oxidant, the oxidant can be purged with hydrogen, which immediately begins the sublimation process. The hydrogen bake can also be conducted within the same temperature range as the oxidation, if desired, such that temperature ramping is not necessary. On the other hand, increasing temperature during the hydrogen bake will increase the rate of sublimation. One of ordinary skill in the art can optimize the process temperature to maximize wafer throughput by determining, for different temperatures in a particular system, the time required for each of temperature ramping and sublimation.

Because carbon has been burned off during the oxidation 102, the hydrogen bake need only evaporate the oxide and can thus be conducted rapidly and at lower temperatures than conventional atmospheric pressure hydrogen bakes. Preferably, the hydrogen bake is conducted below 1150° C. More preferably, the hydrogen bake is conducted at between about 900° C. and 1070° C. for between about 10 seconds and 60 seconds, depending on the oxide thickness.

The rate of sublimation has been found to depend upon hydrogen bake temperature and upon the purity (i.e., level of oxidant partial pressure) of the reducing environment. Most preferably, the hydrogen is pure enough to contain less than about 1 part per billion (ppb) of oxidants. Such purity of the reducing environment can be accomplished, in alternative arrangements, by vacuum pumping the process chamber to about $10^{-7}$ to $10^{-6}$ Torr. For the preferred atmospheric reactor, pure $H_2$ can be obtained through evaporation from cryogenic sources, and the reactor chamber can be effectively sealed from the surrounding "clean room" to provide the desired level of reducing environment purity.

With a reducing environment containing less than about 1 ppb oxidants, an oxide of about 10 Å, the bake step can be completed at 900° C. in only about 10 seconds. Alternatively, with a reducing environment containing greater than about 7 parts per million (ppm) of oxidants, sublimation of 10 Å oxide can be completed at about 1070° C. in about 10 seconds. Similarly, higher temperatures can compensate for higher levels of oxidant leakage into the chamber. Preferably, the oxidant level is kept at least below about 0.1% by volume in the process chamber during hydrogen baking 104.

Figure 5:
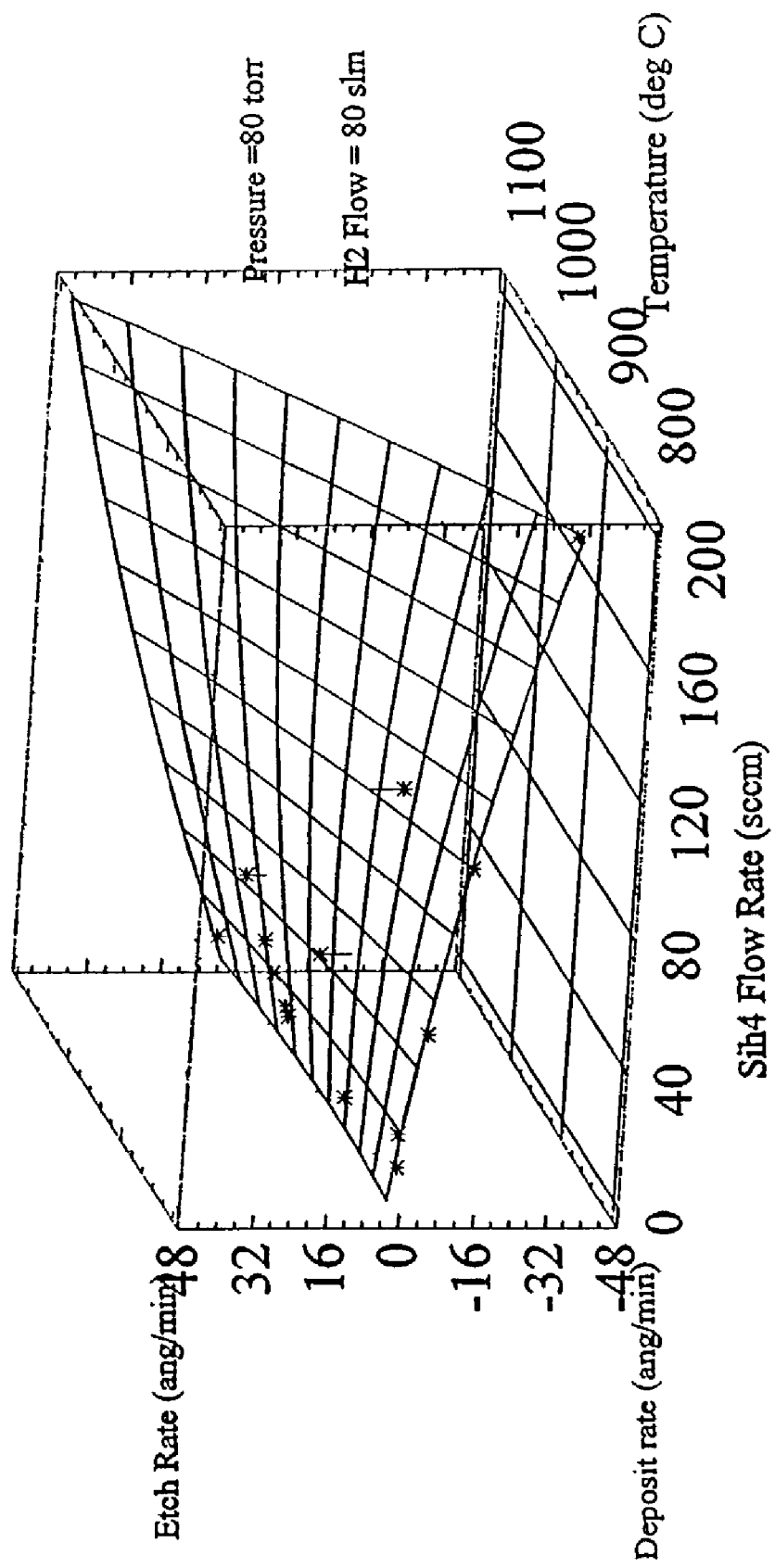
FIG. 5 is a three dimensional graph, illustrating the effect of silane flows and temperature upon oxide sublimation.

With reference to FIG. 5, the addition of small concentrations of silane or germane to the $H_2$ flow can speed the sublimation 104 even further. FIG. 5, for example, illustrates the effect of silane flows and temperature upon the sublimation process. As is readily apparent, for any given silane flow rate (including zero), an increase in temperature increases the rate of sublimation, or oxide etching. At low temperatures (e.g., below about 900° C.), increasing silane flows leads to polysilicon deposition, represented by negative numbers on the vertical axis. At high temperatures (above about 900° C.), on the other hand, the addition of silane increases the rate of sublimation, indicated by positive numbers on the vertical axis.

The hydrogen bake 104 leaves a clean substrate surface for further processing. Carbon is burned off during oxidation 102, while the grown oxide is cleaned during the hydrogen bake 104 by two possible reactions:

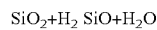

The reactions thus convert the sacrificial oxide to $H_2O$ or SiO vapor, which is exhausted from the process chamber. The substrate surface is thus cleaned of carbon, oxide, and metal impurities can also be removed if HCl is added to either of the oxidation 102 or hydrogen bake 104 processes.

Epitaxial Deposition

In accordance with the preferred embodiments, a silicon source gas is then introduced to initiate deposition 106 of a semiconductor layer, and in particular of an epitaxial silicon layer. $H_2$ flows as a carrier gas. In the illustrated embodiment, the epitaxial layer is deposited 106 upon the substrate within the same process chamber 12 (FIG. 1), and without removing the substrate from the chamber 12 after the hydrogen bake 104.

As is known in the art, epitaxial deposition is a CVD process whereby the deposited layer grows in conformity with the crystal structure of the underlying layer. Temperature ranges and deposition rates depend in general upon the source gas used and other reactor conditions, but in general epitaxy is effected by silane ($SiH_4$) between about 900° C. and 1150° C., by dichlorosilane (DCS or $SiH_2Cl_2$) between about 1000° C. and 1100° C., or by trichlorosilane (TCS or $SiHCl_3$) between about 1050° C. and 1150° C. Significantly, for any of the above silicon sources, the epitaxial deposition 106 can be conducted at the same temperature or higher than the preferred sublimation process 104. Thus, time and energy need not be wasted in elevating the temperature to a high level for hydrogen baking, and then reducing the temperature again for epitaxy.

It will be understood by one of skill in the art that epitaxial semiconductor layers can be intrinsic or in situ doped, selective or non-selective, and can comprise silicon or silicon germanium.

An exemplary epitaxial deposition comprises forming about 3 μm of epitaxial silicon on the substrate by flowing 15 g/min of TCS in a 45 slm flow of $H_2$ carrier for about 45 seconds, with the substrate temperature at about 1120° C. A dopant gas can also be added to the flow to achieve a background dopant level for devices to be formed in the layer in subsequent processing steps. Reactant gases are shut off when a layer of sufficient thickness has formed. $H_2$ can continue to flow until the reactant gases are purged from the chamber.

The resultant epitaxial layer has a contaminant-free, hydrogen-terminated surface (i.e., hydrogen occupies otherwise available valence electrons of surface silicon atoms), which protects the layer from absorbing any contaminants.

Post-Epitaxial Oxidation and Chamber Cleaning

In accordance with one aspect of the invention, the surface can be kept clean by performing an oxidation 108 to grow a protective layer over the epitaxial layer within the same process chamber 12 (FIG. 1). In accordance with the illustrated embodiment, the protective layer comprises a thermally grown oxide over the epitaxial layer. As will be clear from the two subsections below, the oxide may serve simply as a protective layer, or can additionally serve as a gate dielectric layer for transistors to be fabricated.

To maintain the purest possible epitaxial layer, the oxidation 108 is performed in situ, i.e., without removing the substrate from the process chamber 12 in which the epitaxial layer was formed. Furthermore, growing a protective oxide in situ, i.e., without removing the substrate from the chamber, will greatly improve wafer throughput. Preferably, therefore, the oxide layer is grown in situ.

Such in situ oxide growth, however, may come at the expense of increased chamber cleaning costs. Residue from silicon source gases is generally left on surfaces of the reaction chamber 12 after the epitaxial deposition 106. In the past, such residues have been removed with simple HCl vapor etch steps between depositions. Without frequent cleaning, the residue can cloud the quartz reactor walls through which radiant heat must pass for normal operation. Exposing the residue to an oxidation step before the etch step, however, tends to harden the residue, requiring more harmful or costly cleaning steps. Ex situ acid washing the coated surfaces, for example, entails considerable costs in dismantling the process chamber, not to mention the costs of reactor down time during ex situ cleaning of reactor components.

Accordingly, after oxidation 108 and any further processing to be performed within the chamber, the wafer can be removed from the process chamber 12 (FIG. 1), the gate valve closed, and etchants introduced to clean the oxidized or hardened residue. Preferably, $NF_3$ and/or $C_2F_6$ is flowed for a post-oxidation chamber wall cleaning. After the cleaning cycle is complete, the etchants are purged from the reaction chamber 12, the gate valve is opened, and a new wafer can be loaded into the reaction chamber 12.

Alternatively, the substrate with the epitaxial layer can be temporarily removed from the process chamber 12 (FIG. 1) after epitaxial deposition 106, so that the chamber 12 can be subjected to a standard HCl etch cycle. For this alternative process, the substrate is moved to a load lock chamber (not shown), specifically the wafer handling chamber outside the reaction chamber 12, which is isolated from the clean room environment. The load lock chamber is relatively free from contaminants and preferably purged with an inert gas such as hydrogen or nitrogen. The atmosphere in the load lock chamber is thus more pure than that of the clean room which surrounds the reactor.

In accordance with this alternative arrangement, the wafer with the epitaxial layer is transported to the wafer handling chamber by a pick up device which minimizes risk of damage or contamination of the substrate. The preferred pick-up device, described above, shoots high velocity streams of gas outwardly from a downward-facing surface. Use of $H_2$ for the pick-up wand gas streams is preferred, since hydrogen is chemically compatible with the silicon layer to be protected, and can typically be provided in greater purity (i.e., fewer contaminants) than nitrogen. Not only does the preferred pick-up device avoid direct contact with the wafer, but the continual shower of hydrogen gas protects the silicon surface from contamination and maintains the hydrogen-termination.

The substrate can be maintained upon the pick-up device or on a staging station within the load lock chamber while the chamber is cleaned. In the interim, the gate valve to the reaction chamber remains closed. After the cleaning cycle is complete, the etchants are purged from the reaction chamber 12, the gate valve is opened, and the substrate is returned to the reaction chamber 12 from the load lock chamber.

Protective Layer Oxidation

The oxide can serve solely as a protective layer, in accordance with one embodiment. For such use, the oxidation 108 should be conducted until a layer is formed of sufficient thickness to inhibit any contamination from diffusing through the oxide to the silicon surface prior to conducting the next processing step, under normal handling conditions. Preferably, a protective oxide should be between about 20 Å and 200 Å, more preferably between about 30 Å and 100 Å.

As noted above, in situ oxidation 108 is preferred, in order to maximize wafer throughput. After the epitaxial layer has been deposited 106, the oxidizing agent is again turned on. The $H_2$ and silicon source gas need not be purged in a separate step. Rather, the oxidant, in a safe mixture with an inert gas, can perform the purging while immediately beginning the oxidation 108.

Desirably, the oxidation 108 comprises a high quality dry oxidation, and can be grown to any desired thickness, depending upon its intended use. Parameters for the oxidation 108 can be as described with respect to the sacrificial oxidation 102, except for desirably longer oxidation times. As is known, HCl can be added in small amounts to the flow, to improve the quality of the resultant oxide layer.

After formation of such a protective oxide layer, oxidant flow is turned off, and the substrate can be removed 110 to remote sites for further processing. During handling and transportation through normal clean room environments, the epitaxial silicon surface is kept sealed beneath the protective oxide.

Gate Dielectric Oxidation

In accordance with another embodiment, the oxidation 108 can not only protect the underlying semiconductor layer from contamination, but also forms a gate dielectric over the epitaxial layer formed by deposition 106. As with the previously described embodiment, the oxidation 108 in accordance with this embodiment is preferably performed in situ, i.e., without removing the substrate from the processing chamber after the epitaxial deposition. There is thus little or no chance for contamination of the epitaxial layer prior to formation of the gate oxide. The base layer in which transistors will be built thus remains of high quality, and the oxide/epitaxial layer interface can be free of charge-trapping sites. Furthermore, by growing the oxide in the same chamber as the epitaxial layer, several steps can be avoided, such as transportation and cleaning prior to forming a gate oxide with different equipment.

Oxidation for creating a gate oxide can be as described above, although gate oxides are also frequently formed with NO or $N_2O$, which would be provided in a safe mixture, as described with respect to the preferred $O_2/Ar$ mixture. As described with respect to the oxidation 108 for forming a protective layer, HCl can be added to the oxidant flow to improve oxide quality.

For this embodiment, regardless of the particular oxidant, oxidation 108 is extended until a thermal oxide is formed of sufficient thickness for use as a gate oxide. Currently, gate oxides are greater than about 20 Å, and tend to be between about 40 Å and 60 Å. As critical dimensions continue to shrink, future gate oxides may be about 25 Å to 30 Å. Gates designed to allow quantum tunneling, such as for EPROMS, can be thinner still.

Most preferably, oxidation 108 in accordance with a gate dielectric embodiment is followed by a post-oxidation anneal 111. In particular, a high temperature ammonia ($NH_3$) anneal nitridizes the oxide surface, thereby reducing the oxide's boron (or other dopant) diffusion coefficient, as is known in the art. Advantageously, the safe mixture of oxidant 70 (FIG. 2) can be purged with ammonia to immediately begin the anneal, even though ammonia would be explosive when mixed with higher oxidant concentrations.

Gate Conductor Deposition

If the oxidation 108 is used for formation of a gate oxide, a conductive gate layer can also be formed 112 within the same process chamber. Gate conductors typically comprise polysilicon, at least as a first layer over the gate oxide. As the preferred reactor 10 includes a gaseous silicon source and gas line to the process chamber 12, formation of the silicon layer in situ would be advantageous over transporting the substrate 16 to other equipment for deposition.

Accordingly, after oxidation 108 to produce an oxide suitable for use as a transistor gate dielectric, a polysilicon layer is deposited 112 over the oxide layer. It will be understood that the polysilicon is considered directly deposited over the oxide layer, even though the gate oxide is slightly nitridized in accordance with the preferred post-oxidation ammonia anneal 111. Preferred parameters for the polysilicon deposition 112 comprises flowing 350 sccm silane and 45 slm of $H_2$, with the substrate heated to about 650° C. Desirably, the polysilicon layer is also in situ doped for conductivity. The chamber can be maintained at about atmospheric pressure. Under such conditions, a polysilicon layer of about 1,000 Å can formed in about 90 seconds.

After formation of the polysilicon layer, the wafer 16 is transferred to other semiconductor processing equipment for further processing, such as the application of metal strap layers, photolithography and etching to define gates, formation of insulative spacers, self-aligned doping of source and drain regions, metallization steps, etc.

Preferred Structures

Figure 4:
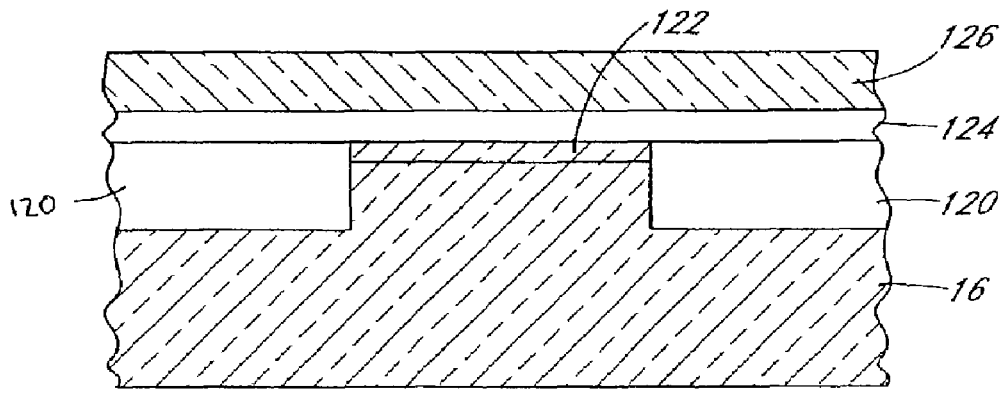
FIG. 4 is a partial schematic section of a substrate processed in accordance with a preferred embodiment.

FIG. 4 illustrates a wafer 16 after processing in accordance with FIG. 3, including the polysilicon deposition 112. The wafer 16 includes field oxide regions 120, defining active area regions. These field oxides 120 are formed outside the preferred reactor in any suitable manner, such as LOCOS, trench fill, or various modifications or combinations of these processes. An epitaxial layer 122 extends the substrate crystal structure in one of the active regions. The epitaxial layer 122 is preferably background doped either n-type or p-type, selectively deposited over the exposed silicon substrate 16 between field oxide regions 120. A high quality gate oxide 124 is formed directly over the epitaxial layer 122, with a clean interface therebetween. A polysilicon gate layer 126 is formed directly over the oxide 124, preferably doped for conductivity.

All of layers 122, 124 and 126 can be formed sequentially within the same single wafer CVD reactor. All three layers are preferably formed without removing the wafer from the processing chamber 12 (FIG. 1). Alternatively, the layers can be formed without removing the wafer from the reactor 10, but the wafer is removed from the processing chamber 12 to a load lock chamber between deposition 106 of the epitaxial layer 120 and growth of the gate oxide 122, to allow cleaning of the process chamber surfaces. In either case, little chance for contamination is presented between formation of the various layers. The processes disclosed herein, and the apparatus for practicing these processes, provide many advantages over conventional processes. The sacrificial oxidation and annealing provides clean substrate surfaces immediately prior to formation of epitaxial layers. Not only is the process cleaner than ex situ alternatives, since it can be performed in situ, but the process is less expensive than alternatives. Aside from shorter processing times, time between processes is minimized by the ability to safely purge hydrogen with oxidant source gases, oxidant sources gases with hydrogen, oxidant source gases with ammonia, etc.

As a result of the pre-clean, high quality layers, and particularly epitaxial silicon layers, can be formed on the cleaned substrate. The preferred process also provides a method of keeping the surface of such layers clean. Since epitaxial layers are often the base layer in which logic devices (e.g., transistors) for integrated circuits are made, the cleaner epitaxial layers produced by the methods disclosed herein can reduce device failure and improve yields for IC fabrication.

Conducting several consecutive processes in the same processing tool or reactor also improves wafer throughput, and hence production costs, considerably. As disclosed herein, three layers of an integrated circuit can all be formed in the same reactor. Furthermore, these layers (epitaxial silicon, gate oxide, and polysilicon gate layers) can be formed in a single-wafer processing chamber, with the attendant high degree of process control.

It will be appreciated by those skilled in the art that various modifications and changes may be made without departing from the scope of the invention. For example, gate oxide growth 108 in a single wafer CVD reactor, followed by in situ formation 112 of a conductive gate layer, can be advantageous even without previous deposition of an epitaxial layer. Similarly, wafers can be cleaned within the preferred reactor by the disclosed sacrificial oxidation 102 and in situ hydrogen bake even without subsequent in situ layer formation. Similar other modifications and changes are intended to fall within the scope of the invention, as defined by the appended claims.

What is claimed is:

1. A method of processing a semiconductor substrate, comprising:

forming an epitaxial layer on the substrate in a single substrate chemical vapor deposition chamber;

forming an oxide layer directly on the epitaxial layer in the same chamber;

removing the substrate from the chamber after forming the oxide layer; and transporting the substrate to a remote location for further processing, wherein removing is conducted immediately after forming the oxide layer, further comprising growing a sacrificial oxide layer and sublimating the sacrificial oxide layer within the deposition chamber before forming the epitaxial layer.

2. The method of claim 1, wherein forming the epitaxial layer comprises a thermal chemical vapor deposition.

3. The method of claim 1, wherein forming the oxide layer comprises radiantly heating the substrate through radiation-transparent walls of the deposition chamber.

4. The method of claim 3, wherein forming the oxide layer comprises exposing the epitaxial layer to an oxidant source gas.

5. The method of claim 4, wherein exposing the epitaxial layer to an oxidant source gas purges reactants used to form the epitaxial layer from the deposition chamber.

6. A method of processing a semiconductor substrate, comprising:
   forming an epitaxial layer on the substrate in a single substrate chemical vapor deposition chamber;
   forming an oxide layer directly on the epitaxial layer in the same chamber;
   removing the substrate from the chamber after forming the oxide layer; and
   transporting the substrate to a remote location for further processing,
   wherein removing is conducted immediately after forming the oxide layer,
   further comprising cleaning an interior of the deposition chamber while the substrate is outside of the deposition chamber, wherein cleaning comprises exposing interior surfaces of the deposition chamber to an etchant, wherein cleaning is performed after forming the epitaxial layer and before forming the oxide layer.

7. The method of claim 6, wherein the etchant comprises HCl.

8. The method of claim 6, wherein the substrate is moved into a second chamber having an atmosphere comprising inert gas after forming the epitaxial layer and before cleaning the deposition chamber.

9. The method of claim 8, wherein the inert gas comprises nitrogen.

10. The method of claim 8, wherein the inert gas comprises hydrogen.

11. The method of claim 6, wherein cleaning is performed after removing the substrate from the deposition chamber.

12. The method of claim 11, wherein the etchant comprises fluorine.

13. A method of processing a semiconductor substrate, comprising:
   forming an epitaxial layer on the substrate in a single substrate chemical vapor deposition chamber;
   forming an oxide layer directly on the epitaxial layer in the same chamber
   removing the substrate from the chamber after forming the oxide layer; and
   transporting the substrate to a remote location for further processing,
   wherein removing is conducted immediately after forming the oxide layer, wherein HCl is added to a flow of the oxidant source gas.

14. The method of claim 1, wherein the oxide layer has a thickness between about 20 Å and 200 Å.

15. The method of claim 14, wherein the oxide layer has a thickness between about 30 Å and 100 Å.

* * * * *

UNITED STATES PATENT AND TRADEMARK OFFICE
CERTIFICATE OF CORRECTION

PATENT NO.         : 7,112,538 B2                                              Page 1 of 1
APPLICATION NO. : 10/293795
DATED              : September 26, 2006
INVENTOR(S)        : Ferro et al.

It is certified that error appears in the above-identified patent and that said Letters Patent is hereby corrected as shown below:

First Page Column 2 (Other Publications); Line 1; Delete "Uding" and insert -- Using --, therefor.

Page 2 Column 1 (U.S. Patent Documents); Line 2; Delete "427/39" and insert -- 427/564 --, therefor.

Column 4; Line 42 (Approx.); After "wafer" insert -- 16. --.

Column 16; Line 22; In Claim 13, after "chamber" insert -- ; --.

Signed and Sealed this

Thirteenth Day of February, 2007

JON W. DUDAS
*Director of the United States Patent and Trademark Office*